(12) United States Patent
Lai et al.

(10) Patent No.: US 7,199,453 B2
(45) Date of Patent: Apr. 3, 2007

(54) SEMICONDUCTOR PACKAGE AND FABRICATION METHOD THEREOF

(75) Inventors: Jeng-Yuan Lai, Taichung Hsien (TW); Chun-Lung Chen, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 11/041,764

(22) Filed: Jan. 24, 2005

(65) Prior Publication Data

US 2006/0118941 A1    Jun. 8, 2006

(30) Foreign Application Priority Data

Dec. 2, 2004   (TW) .............................. 93137143 A

(51) Int. Cl.
*H01L 23/495* (2006.01)
(52) U.S. Cl. .................. 257/666; 438/107; 438/617; 438/109; 257/784; 257/787; 257/724; 257/686
(58) Field of Classification Search ................ 257/690
See application file for complete search history.

(56) References Cited

U.S. PATENT DOCUMENTS

| | | | |
|---|---|---|---|
| 4,862,245 A | | 8/1989 | Pashby et al. |
| 6,048,755 A | * | 4/2000 | Jiang et al. ................ 438/118 |
| 6,218,731 B1 | | 4/2001 | Huang et al. |
| 6,847,104 B2 | * | 1/2005 | Huang et al. ............... 257/685 |
| 2003/0034553 A1 | * | 2/2003 | Ano ............................ 257/690 |

* cited by examiner

*Primary Examiner*—Evan Pert
*Assistant Examiner*—Krista Soderholm
(74) *Attorney, Agent, or Firm*—Peter F. Corless; Steven M. Jensen; Edwards Angell Palmer & Dodge LLP

(57) ABSTRACT

A semiconductor package and a fabrication method thereof are proposed. A lead frame is provided between a chip and a substrate in a window ball grid array semiconductor package, wherein an active surface of the chip is electrically connected to the lead frame via bonding wires formed in an opening of the substrate and is electrically connected to the substrate via the lead frame. The provision of lead frame can improve the heat dissipating efficiency and electrical performances. The bonding wires located in the opening of the substrate eliminate the prior-art drawback of requiring different molds in response to different opening structures of a substrate.

11 Claims, 5 Drawing Sheets

SEMICONDUCTOR PACKAGE AND FABRICATION METHOD THEREOF

FIELD OF THE INVENTION

The present invention relates to semiconductor packaging technologies, and more particularly, to a semiconductor package and a fabrication method thereof.

BACKGROUND OF THE INVENTION

Along with the advancement of semiconductor fabrication technology and the continuous improvement in circuit functionality of chips, in order to satisfy requirements for various effectively developed portable products in the fields of communications, networks and computers, semiconductor packages capable of reducing an IC (integrated circuit) area and having high density and multiple leads, such as ball grid array (BGA) packages, flip-chip (FC) packages, chip size packages (CSPs) and multi chip modules (MCMs), have become mainstream package products.

In the semiconductor packaging technology applied to an advanced product such as a memory, a semiconductor package with a central-pad chip is generally adopted and capable of reducing the length of bonding wires to improve the electrical quality of signal transmission. Accordingly, the IBM (International Business Machines) Corporation has proposed a lead-on-chip (LOC) package by U.S. Pat. No. 4,862,245, which utilizes a plurality of leads of a lead frame to provide external signal transmission for a chip incorporated in the package. Although this LOC package structure avoids the use of a substrate and is relatively more economically beneficial, the signal transmission path through the leads is considered lengthy and may adversely affect the electrical quality, making such package structure not suitable for products having a frequency over 500 MHz such as DRAM (dynamic random access memory), SDRAM (synchronous DRAM), DDR SDRAM (double data-rate SDRAM), etc. Moreover, since the leads of the lead frame are used to provide the external signal transmission for the chip, this sets a limitation on the number of input/output (I/O) connections that can be disposed on a unit area, and thus the package structure is not suitably applied to the foregoing high-frequency products.

In order to satisfy the requirements of electrical quality and high I/O connections for the foregoing high-frequency products, there has been developed a window ball grid array (WBGA) package structure, which uses a substrate having at least one opening therethrough, and allows a chip to be mounted on an upper surface of the substrate and cover the opening in a face-down manner, with a plurality of bonding wires (gold wires) being received in the opening to electrically connect the chip to a lower surface of the substrate. This WBGA package structure can further effectively reduce the length of the leads mentioned above to thereby improve the electrical transmission quality between the chip and the substrate, and thus has been widely applied to a semiconductor package with a chip having central pads such as DRAM.

U.S. Pat. No. 6,218,731 has disclosed a WBGA semiconductor package. As shown in FIG. 1, this semiconductor package 1 comprises a substrate 11 having a central opening 111; a chip 12 mounted on an upper surface of the chip 11 via an adhesive layer 123 in a face-down manner that bond pads 122 formed on an active surface 121 of the chip 12 are exposed to the opening 111; a plurality of bonding wires 13 formed in the opening 111, for electrically connecting the chip 12 to the substrate 11, such that the bond pads 122 of the chip 12 are electrically connected to a lower surface of the substrate 11; a first encapsulant 14 formed on the upper surface of the substrate 11 to encapsulate the chip 12; a second encapsulant 141 formed on the lower surface of the substrate 11 and filling the opening 111; and a plurality of solder balls 15 implanted at a plurality of ball pads 151 located on areas of the lower surface of the substrate 11 not having the second encapsulant 141, the solder balls 15 for being electrically connected to an external electronic device.

For the cost concern, the above conventional semiconductor package 1 is usually fabricated in a batch manner that a substrate strip comprising a plurality of the substrates 11 arranged in an array is used to form and mold a plurality of package units thereon, and then the package units are subjected to a singulation process. As shown in FIG. 2, after the die-bonding and wire-bonding processes have been completed for the array-arranged substrates 11, the substrate strip is placed into an encapsulating mold 16 and clamped between an upper mold 161 and a lower mold 162 of the encapsulating mold 16. Then, conventional steps of mold engagement, resin injection and curing are performed, such that the first encapsulant 14 is formed on the upper surface of the substrate strip to encapsulate all of the chips 12 mounted on the substrates 11, and the second encapsulant 141 is formed on the lower surface of each of the substrates 11 to encapsulate the bonding wires 13 received in the opening 111 of each of the substrates 11. Subsequently, a ball-implanting process and a singulation process are carried out to form a plurality of individual WBGA semiconductor packages 1.

However, the foregoing conventional WBGA semiconductor package 1 has a structural limitation that wire loops of the bonding wires 13 must be protruded from the lower surface of the substrate 11, and thus the second encapsulant 141 for encapsulating the bonding wires 13 would be further protruded on the lower surface of the substrate 11. As a result, different lower molds 162 are required in response to different structures of openings 111 of various substrates 11, thereby effectively increasing the fabrication cost.

Moreover, since positions on the substrate 11 predetermined for forming the first encapsulant 14 and the second encapsulant 141 do not exactly correspond to each other, the upper and lower molds 161, 162 may not be able to firmly clamp the substrate 11 therebetween and thus cause flashes of the second encapsulant 141 on the lower surface of the substrate 11. This not only impairs the exterior appearance of the semiconductor package 1 but also may affect the process of implanting solder balls 15 and the electrical quality thereof if ball pads on the lower surface of the substrate 11 are contaminated by the resin flashes. As such, an additional deflash process is required to remove the resin flashes by using solvents, thereby making the fabrication processes complicated, and also the issue of contaminating the ball pads is raised.

In order to completely encapsulate the wire loops of the bonding wires 13, the second encapsulant 141 usually occupies an excessively large area on the substrate 11, and this would limit the number and density of the solder balls 15 or I/O connections capable of being arranged on the substrate 11. Furthermore, in order not to affect a subsequent reflow-soldering process, the height of the solder balls 15 must be greater than a distance between a bottom surface of the second encapsulant 141 and the lower surface of the substrate 11. This height requirement also governs the diameter of the solder balls 15 and sets a further limitation on the number of solder balls 15 capable of being disposed on the lower surface of the substrate 11. As a result, the even less I/O connections can be accommodated in the semiconductor package 1.

Additionally, in the foregoing conventional WBGA semiconductor package 1, heat produced by operation of the chip 12 is indirectly conducted outwards through the substrate 11. Such indirect heat transmitting path does not provide any mechanism for actively improving the heat dissipating efficiency. Thus, the WBGA semiconductor package 1 if being applied to a high-frequency product may easily degrade electrical performances due to unsatisfactory heat dissipating effect.

Therefore, the problem to be solved here is to provide a semiconductor packaging technology, which can resolve the above drawbacks in the prior art to improve the heat dissipating efficiency and electrical quality, without having to fabricate different lower molds in response to different structures of substrate openings, thereby increasing the yield of the overall fabrication processes, simplifying the fabrication processes, and reducing the fabrication cost.

SUMMARY OF THE INVENTION

In light of the above drawbacks in the prior art, an objective of the present invention is to provide a semiconductor package and a fabrication method thereof, without having to fabricate different lower molds in response to different structures of substrate openings.

Another objective of the present invention is to provide a semiconductor package and a fabrication method thereof, so as to prevent resin flashes over ball pads.

Still another objective of the present invention is to provide a semiconductor package and a fabrication method thereof, so as to improve the electrical quality of the semiconductor package.

A further objective of the present invention is to provide a semiconductor package and a fabrication method thereof, so as to improve the heat dissipating efficiency of the semiconductor package.

A further objective of the present invention is to provide a semiconductor package and a fabrication method thereof, which can increase the number of input/output connections capable of being arranged in a unit area.

In accordance with the above and other objectives, the present invention proposes a semiconductor package, comprising a substrate at least having an upper surface, a lower surface opposed to the upper surface, and an opening formed through the upper and lower surfaces, wherein a first circuit layer and a second circuit layer are respectively formed on the upper surface and the lower surface of the substrate and are electrically connected to each other; a lead frame mounted on the substrate and having a plurality of leads electrically connected to the first circuit layer; a chip having an active surface and a non-active surface, wherein the active surface of the chip is mounted on the lead frame and is electrically connected to the leads via a plurality of bonding wires formed in the opening of the substrate; and an encapsulant for filling the opening and encapsulating the chip, the lead frame and the upper surface of the substrate.

The foregoing encapsulant filling the opening has a surface flush with the lower surface of the substrate. The encapsulant can completely encapsulate the chip. Preferably, the encapsulant may encapsulate the periphery of the chip, allowing the non-active surface of the chip to be exposed from the encapsulant so as to improve the heat dissipating performances for a working heat source.

The leads of the lead frame are electrically connected to the first circuit layer via at least one conductive element such as an electrically conductive adhesive, solder, or bonding wires.

Moreover, the chip is mounted on the lead frame via an adhesive layer. The adhesive layer can be made of an insulating tape or an adhesive. Preferably, an insulating thermally conductive adhesive having better thermal conductivity is used as the adhesive layer.

The present invention also proposes a fabrication method of a semiconductor package, comprising the steps of: preparing a substrate having an opening, a lead frame having a plurality of leads, and at least one chip having an active surface and a non-active surface, wherein the substrate further comprises an upper surface and a lower surface opposed to the upper surface, with a first circuit layer and a second circuit layer being respectively formed on the upper surface and the lower, surface of the substrate and being electrically connected to each other; mounting the lead frame on the substrate, and allowing the plurality of leads to be electrically connected to the first circuit layer on the upper surface of the substrate; mounting the active surface of the chip on the lead frame, and electrically connecting the active surface to the plurality of leads via a plurality of bonding wires formed in the opening of the substrate; and forming an encapsulant on the substrate to fill the opening and encapsulate the chip, the lead frame and the upper surface of the substrate.

The foregoing encapsulant filling the opening has a surface flush with the lower surface of the substrate. The encapsulant can completely encapsulate the chip. Preferably, the encapsulant may encapsulate the periphery of the chip, allowing the non-active surface of the chip to be exposed from the encapsulant so as to improve the heat dissipating performances for a working heat source.

The leads of the lead frame are electrically connected to the first circuit layer via at least one conductive element such as an electrically conductive adhesive, solder, or bonding wires.

Moreover, the chip is mounted on the lead frame via an adhesive layer. The adhesive layer can be made of an insulating tape or an adhesive. Preferably, an insulating thermally conductive adhesive having better thermal conductivity is used as the adhesive layer.

The above semiconductor package and its fabrication method in the present invention additionally provide a lead frame between a chip and a substrate in a conventional window ball grid array (WBGA) package, wherein an active surface of the chip is electrically connected to the lead frame via bonding wires formed in an opening of the substrate and is then electrically connected to the substrate via the lead frame. Since the bonding wires are received in the opening of the substrate, an encapsulant filling the opening would not be protruded from a lower surface of the substrate, and thus a transfer mold can be used. This simplifies the mold requirement and does not require different lower molds in response to different structures of substrate openings, thereby overcoming the drawback in the prior art that different lower molds corresponding to different opening structures must be prepared, and reducing the mold cost in the present invention. Moreover, as the encapsulant is not protruded out of the lower surface of the substrate, the transfer mold is sufficiently used to prevent resin flashes over ball pads. This can assure the electrical quality of a ball-implanting process and eliminate the drawbacks of complicated fabrication processes and contamination of ball pads in the prior art.

Further as the encapsulant is not protruded from the lower surface of the substrate, it would not occupy areas on the substrate outside the opening, such that more input/output (I/O) connections can be disposed on the lower surface of the substrate. Since the height requirement of solder balls in the prior art can be overcome in the present invention, there is no particular limitation on the diameter relative to the number of the solder balls, such that the number of I/O connections being arranged in a unit area can be further increased.

In addition, the provision of lead frame provides an active heat transmitting path for the working heat source i.e. the chip and thus improves the heat dissipating efficiency. This facilitates an application of the semiconductor package to a high-frequency product, and can stably maintain the electrical performances of the semiconductor package. Moreover, compared to the convention LOC package structure, the length of the leads of the lead frame used in the present invention is significantly reduced, which can correspondingly provide an extremely short signal transmitting path to reduce noise and enhance the electrical quality.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a semiconductor package and a fabrication method thereof proposed in the present invention are described in detail with reference to FIGS. 3 to 6. The semiconductor package and its fabrication method according to the present invention can be widely applied to a package structure generally using a substrate as a chip carrier. The drawings and following description exemplify a ball grid array (BGA) semiconductor package for illustration only and do not set a limitation to the present invention.

First Preferred Embodiment

Figure 1:
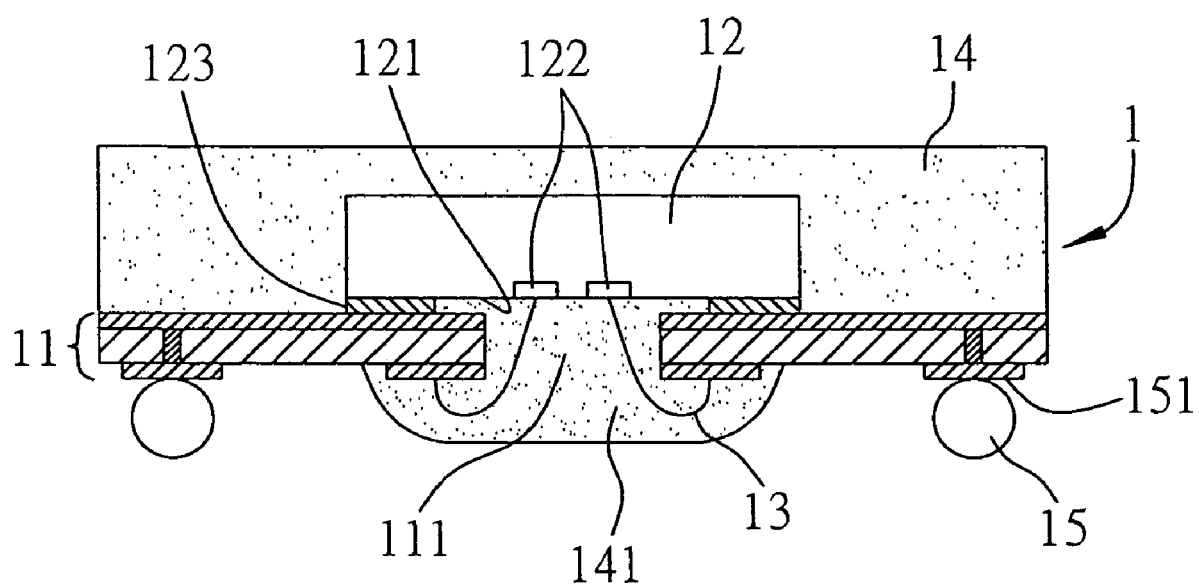
FIG. 1 (PRIOR ART) is a cross-sectional view of a conventional semiconductor package disclosed in U.S. Pat. No. 6,218,731.
Figure 2:
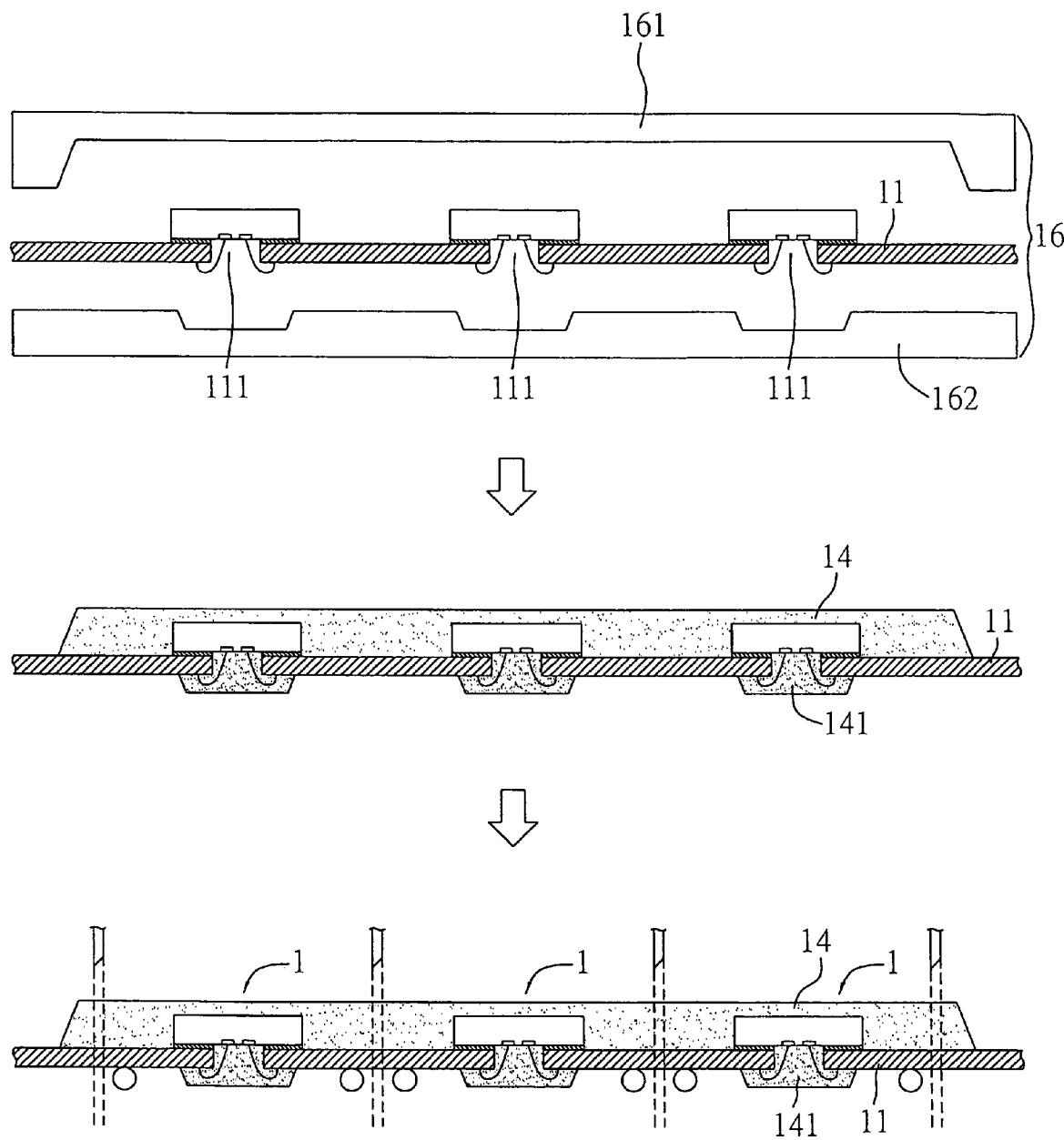
FIG. 2 (PRIOR ART) is a flowchart showing molding and singulation processes being performed on the semiconductor package in FIG. 1.
Figure 3:
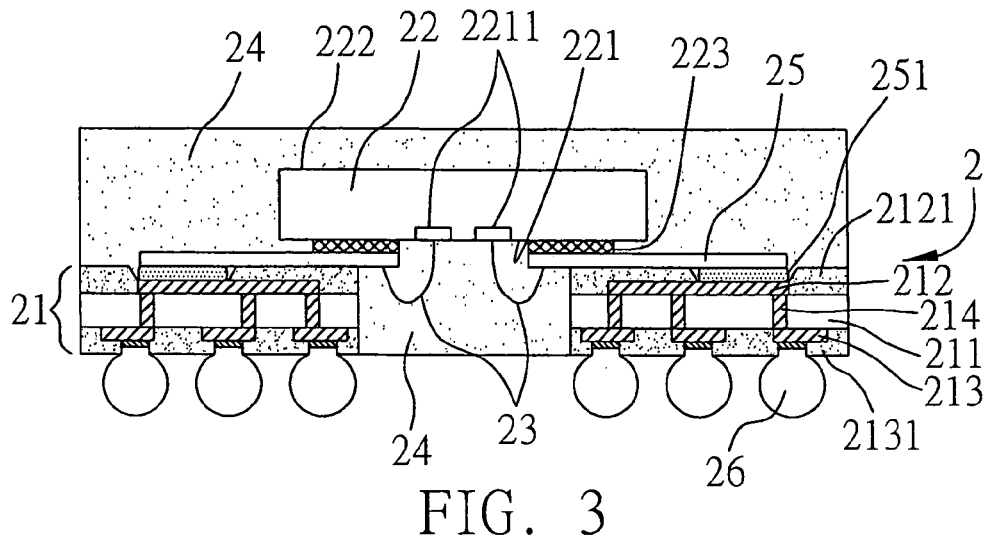
FIG. 3 is a cross-sectional view of a semiconductor package according to a first preferred embodiment of the present invention.

FIG. 3 shows the semiconductor package according to a first preferred embodiment of the present invention. As shown in FIG. 3, this semiconductor package 2 comprises a substrate 21, at least one chip 22, a plurality of bonding wires 23, a lead frame 25, and an encapsulant 24.

Figure 6A:
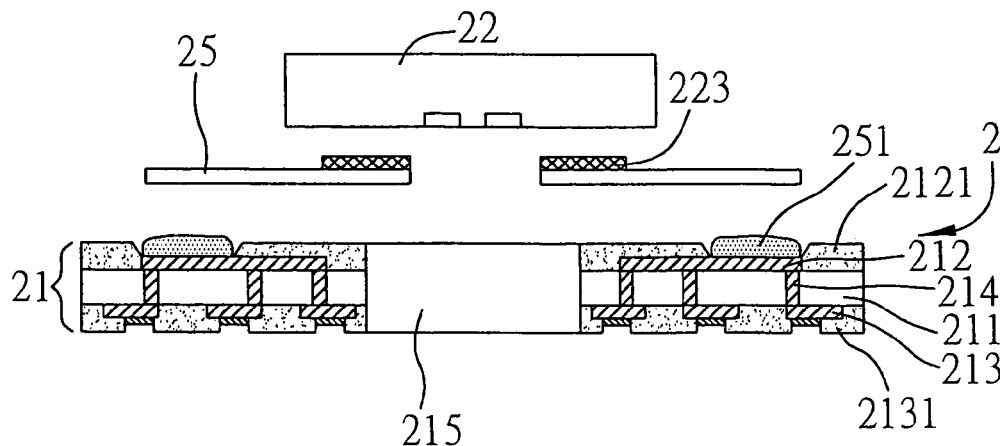
FIGS. 6A to 6D are schematic diagrams showing a fabrication method of the semiconductor package according to the present invention.

The substrate 21 at least has a first circuit layer 212, an insulating core layer 211 and a second circuit layer 213, which are successively stacked together. The first circuit layer 212 comprises a plurality of conductive circuits, with a bonding portion being formed in each of the conductive circuits. The second circuit layer 213 comprises a plurality of ball pads, and a solder ball 26 such as a tin ball is implanted on each of the ball pads. The bonding portions are electrically connected to the ball pads by a plurality of conductive channels such as conductive vias 214 formed through the core layer 211. The first circuit layer 212 further comprises a solder mask layer 2121 provided on a surface thereof, wherein the solder mask layer 2121 is formed with a plurality of holes corresponding to the bonding portions. The second circuit layer 213 further comprises a solder mask layer 2131 provided on a surface thereof, wherein the solder mask layer 2131 is formed with a plurality of holes corresponding to the ball pads. An opening 215 is formed at a central position of the substrate 21 and penetrates the first circuit layer 212, the core layer 211 and the second circuit layer 213 (as shown in FIG. 6A). Preferably, the opening 215 is slightly smaller than the chip 22 to enhance the structure strength for carrying the chip 22. It should be noted that the substrate 21 is not a characteristic feature of the present invention, such that a general WBGA substrate, or a multi-layer substrate having at least one third circuit layer and a plurality of core layers, can also be used as the substrate 21 in the present invention. U.S. Pat. No. 6,218,731 has detailed a similar substrate structure, and thus no further description of the substrate 21 would be provided here.

The lead frame 25 is mounted on the substrate 21 and comprises a plurality of leads. The leads are electrically connected to the plurality of bonding portions of the first circuit layer 212 via at least one conductive element such as solder 251. The conductive element may also comprise an electrically conductive adhesive.

The chip 22 has an active surface 221 and a non-active surface 222, wherein a plurality of bond pads 2211 are formed at central positions on the active surface 221. The active surface 221 of the chip 22 is mounted on the lead frame 25 via a first adhesive layer 223 such as an insulating tape, adhesive or insulating thermally conductive adhesive. The plurality of bond pads 2211 of the active surface 221 are electrically connected to the plurality of leads of the lead frame 25 via a plurality of bonding wires 23 formed in the opening of the substrate 21.

The encapsulant 24 fills the opening of the substrate 21 and encapsulates the lead frame 25, an upper surface of the substrate 21 (the first circuit layer 212, the solder mask layer 2121) and the entire chip 22. Since the plurality of bonding wires 23 are received in the opening of the substrate 21, the encapsulant 24 filling the opening can have a surface flush with a lower surface of the substrate 21 (the second circuit layer 213, the solder mask layer 2131).

The foregoing semiconductor package 2 is additionally provided with a lead frame 25 between the chip 22 and the substrate 21 of a WBGA semiconductor package, allowing the active surface 221 of the chip 22 to be electrically connected to the lead frame 25 via the bonding wires 23 formed in the opening of the substrate 21 and to be electrically connected to the substrate 21 via the lead frame 25. Since the bonding wires 23 are received in the opening of the substrate 21, the encapsulant 24 filling the opening would not be protruded from the lower surface of the substrate 21, such that a transfer mold can be used and thus the mold requirement is simplified without having to fabricate different lower molds in response to different structures of substrate openings, thereby overcoming the drawback in the prior art that different lower molds corresponding to different opening structures must be prepared, and reducing the mold cost in the present invention. Moreover, since the encapsulant 24 is not protruded from the lower surface of the substrate 21, the transfer mold is sufficiently used to prevent resin flashes over the ball pads, such that the electrical quality of a process for implanting the solder balls 26 can be assured, and the drawbacks in the prior art of complicated fabrication processes and contamination of ball pads can be resolved.

Further as the encapsulant 24 is not protruded from the lower surface of the substrate 21, it would not occupy areas on the substrate 21 outside the opening, and thus more input/output (I/O) connections can be disposed on the lower surface of the substrate 21. Since the height requirement of solder balls in the prior art can be overcome in the present invention, there is no particular limitation on the diameter relative to the number of the solder balls 26, such that the number of I/O connections being arranged in a unit area can be further increased.

In addition, the provision of lead frame 25 provides an active heat transmitting path for the working heat source i.e. the chip 22 and thus improves the heat dissipating efficiency. This facilitates an application of the semiconductor package 2 to a high-frequency product, and can stably maintain the electrical performances of the semiconductor package. Moreover, compared to the convention LOC package structure, the length of the leads of the lead frame 25 used in the present invention is significantly reduced, which can correspondingly provide an extremely short signal transmitting path to reduce noise and enhance the electrical quality.

Second Preferred Embodiment

Figure 4:
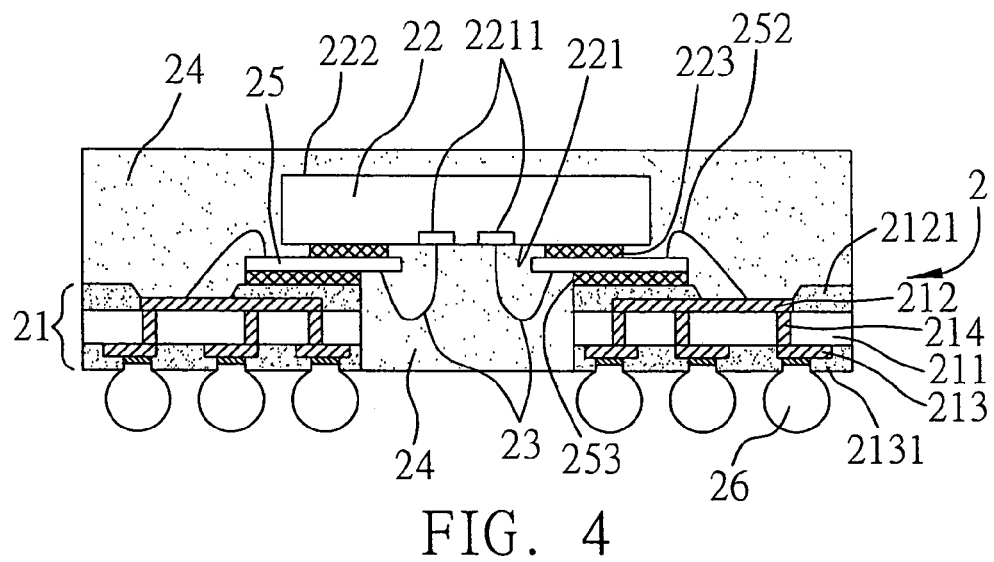
FIG. 4 is a cross-sectional view of the semiconductor package according to a second preferred embodiment of the present invention.

FIG. 4 shows the semiconductor package according to a second preferred embodiment of the present invention. The components in this second embodiment same as those in the above first embodiment are designated with the same reference numerals and are not repeated with the same detailed description for the purposes of simplification and clarification. As shown in FIG. 4, the second embodiment differs from the above first embodiment in that the conductive element for electrically connecting the plurality of leads to the bonding portions is not limited to the solder 251, but bonding wires 252 such as gold wires can be used in this embodiment to achieve this electrical connection. In this embodiment, besides being electrically connected to the substrate 21 via the bonding wires 252, the lead frame 25 is preferably attached to the substrate 21 via a second adhesive layer 253 such as an insulating tape or adhesive. The arrangement of this embodiment can yield the same advantages and effects as the first embodiment, and further provides an even shorter signal transmitting path, reduces noise, and improves the electrical quality as the leads of the lead frame 25 can be further shortened.

Third Preferred Embodiment

Figure 5:
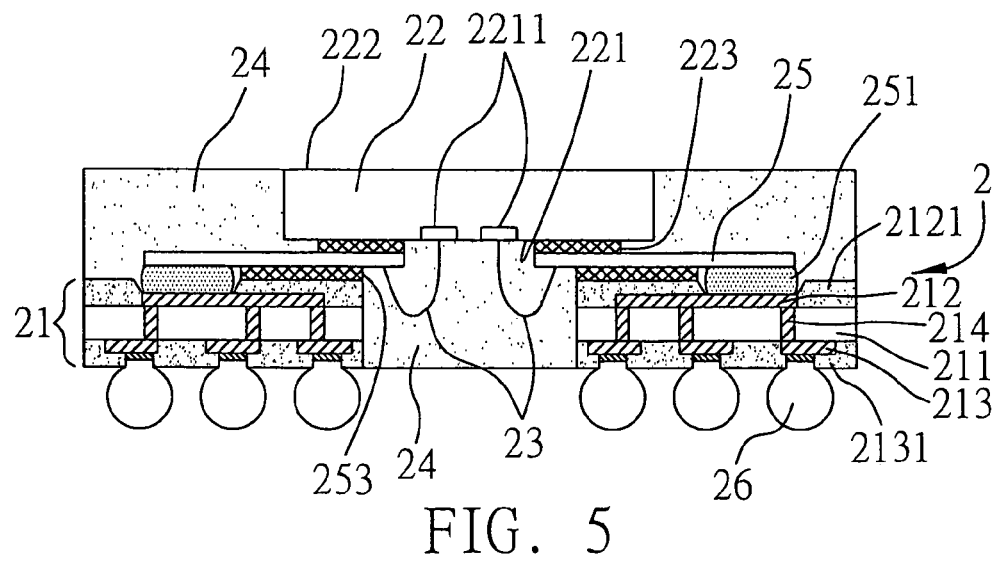
FIG. 5 is a cross-sectional view of the semiconductor package according to a third preferred embodiment of the present invention.

FIG. 5 shows the semiconductor package according to a third preferred embodiment of the present invention. The components in this third embodiment same as those in the above first embodiment are designated with the same reference numerals and are not repeated with the same detailed description for the purposes of simplification and clarification. As shown in FIG. 5, the third embodiment differs from the above first embodiment in that the encapsulant 24 is not limited to one encapsulating the entire chip 22, but can only encapsulate the periphery of the chip 22 with the non-active surface 222 of the chip 22 being exposed in this embodiment. The arrangement of this embodiment can yield the same advantages and effects as the first embodiment, and further improves the heat dissipating performances of the working heat source due to the exposed non-active surface 222 of the chip 22. This further facilitates an application of the semiconductor package to a high-frequency product, and can stably maintain the electrical performances of the semiconductor package. Moreover, besides being electrically connected to the substrate 21 via the conductive element, the lead frame 25 can be attached to the substrate 21 via a second adhesive layer 253 such as an insulating tape or adhesive to provide better bonding strength therebetween.

The semiconductor package according to the present invention can be fabricated by a method shown in FIGS. 6A to 6D.

First referring to FIG. 6A, a substrate 21, a lead frame 25 and at least one chip 22 are prepared. A first adhesive layer 223 is provided on a plurality of leads of the lead frame 25. The substrate 21 at least has a first circuit layer 212 and a second circuit layer 213, wherein the first circuit layer 212 and the second circuit layer 213 are separated by a core layer 211 and are electrically connected to each other via a plurality of conductive vias 214 in the core layer 211. The substrate 21 further comprises an opening 215 formed through the first circuit layer 212, the core layer 211 and the second circuit layer 213. At least one conductive element such as solder 251 can be formed on the first circuit layer 212. Since the substrate 21, the lead frame 25 and the chip 22 are structurally the same as those detailed for the foregoing semiconductor package 2 and thus not to be further described here.

Figure 6B:
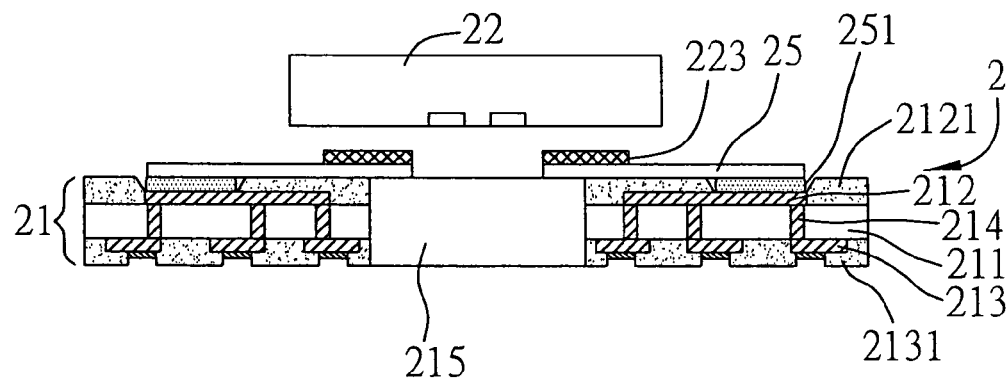

Then referring to FIG. 6B, the lead frame 25 is mounted on the substrate 21, and the plurality of leads of the lead frame 25 are electrically connected to the first circuit layer 212 via the solder 251. The conductive element used for this electrical connection is not limited to the solder 251 but can also be an electrically conductive adhesive. Such structural modification does not affect the order of the fabrication processes being performed and is thus not to be further detailed here.

Figure 6C:
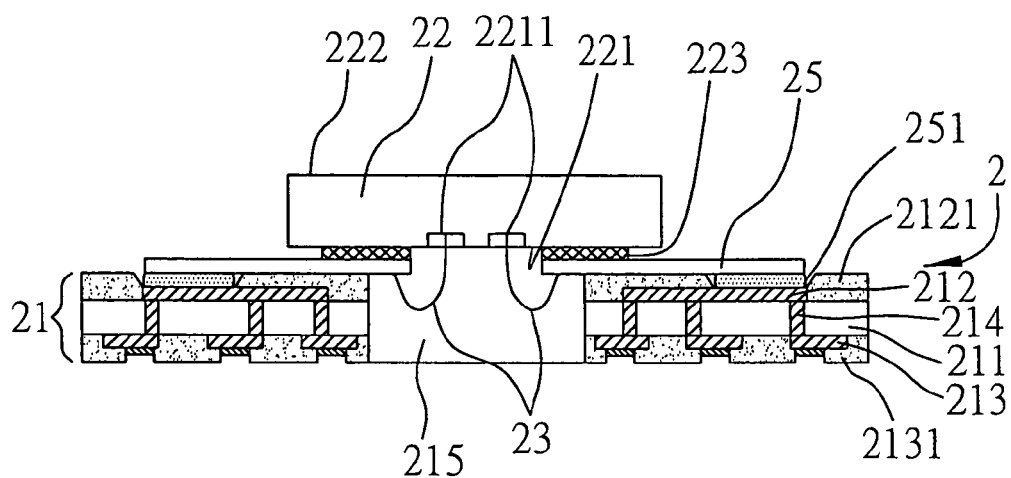

Subsequently referring to FIG. 6C, a die-bonding process and a wire-bonding process are performed. The chip 22 is mounted on the lead frame 25 via the first adhesive layer 223 in advance provided on the lead frame 25 in a manner that an active surface 221 of the chip 22 faces downwards and a plurality of bond pads 2211 on the active surface 221 of the chip 22 correspond to the opening 215 of the substrate 21. Then, the plurality of bond pads 2211 of the active surface 221 are electrically connected to the plurality of leads of the lead frame 25 via a plurality of bonding wires 23 such as gold wires formed in the opening 215 of the substrate 21.

Figure 6D:
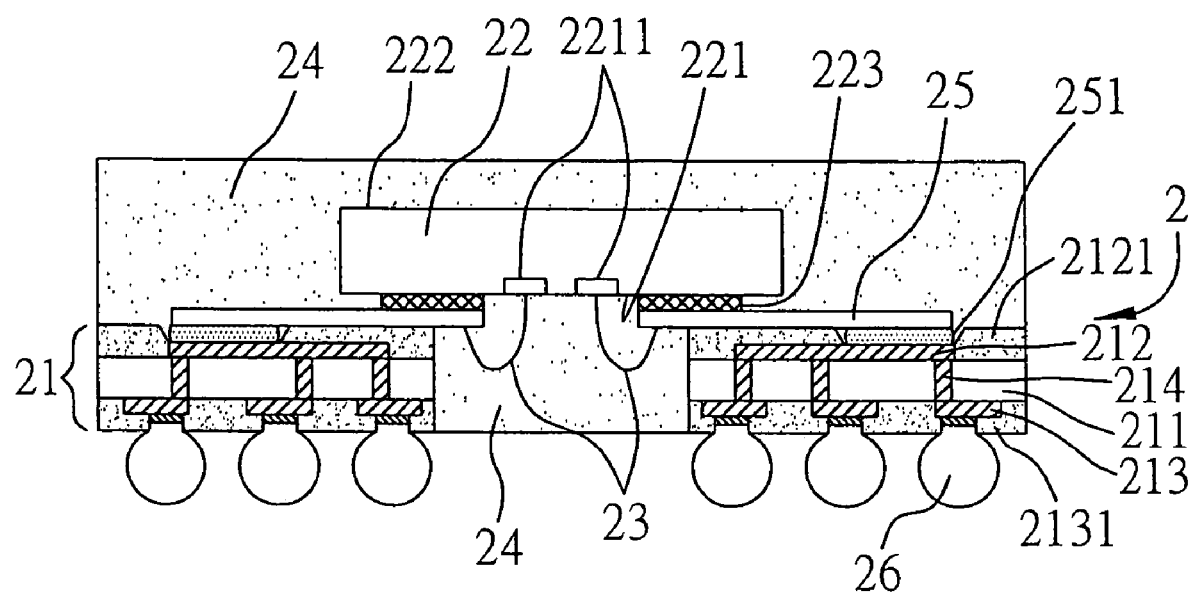

Finally, a molding process and a ball-implanting process, and optionally a singulation process, are performed so as to completely fabricate the semiconductor package 2 as shown in FIG. 6D. A transfer mold is used during the molding process to form an encapsulant 24 on the substrate 21, and the encapsulant 24 fills the opening 215 and encapsulates the chip 22, the lead frame 25 and the upper surface of the substrate 21 (the first circuit layer 212, the solder mask layer 2121).

Therefore, by the semiconductor package and its fabrication method according to the present invention, since the bonding wires are received in the opening of the substrate, the encapsulant filling the opening is not protruded from the lower surface of the substrate, such that the transfer mold can be used and thus the mold requirement is simplified without having to fabricate different lower molds in response to different structures of substrate openings, thereby overcoming the drawback in the prior art that different lower molds corresponding to different opening structures must be prepared, and reducing the mold cost in the present invention. Moreover, since the encapsulant is not protruded from the lower surface of the substrate, the transfer mold is sufficiently used to prevent resin flashes over the ball pads, such that the electrical quality of the ball-implanting process can be assured, and the drawbacks in the prior art of complicated fabrication processes and contamination of ball pads can be resolved. Further as the encapsulant is not protruded from the lower surface of the substrate, it would not occupy areas on the substrate outside the opening, and thus more I/O connections can be disposed on the lower surface of the substrate. Since the height requirement of solder balls in the prior art can be overcome in the present invention, there is no particular limitation on the diameter relative to the number of the solder balls, such that the number of I/O connections being arranged in a unit area can be further increased. In addition, the provision of lead frame provides an active heat transmitting path for the working heat source i.e. the chip and thus improves the heat dissipating efficiency. This facilitates an application of the semiconductor package to a high-frequency product, and can stably maintain the electrical performances of the semiconductor package. Moreover, compared to the convention LOC package structure, the length of the leads of the lead frame used in the present invention is significantly reduced, which can correspondingly provide an extremely short signal transmitting path to reduce noise and enhance the electrical quality. As a result, the semiconductor package and its fabrication method in the present invention can desirably eliminate the drawbacks in the prior art and yield the foregoing effects and improvements, thereby having high industrial practicability.

The present invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package comprising:
   a substrate at least having an upper surface, a lower surface opposed to the upper surface, and an opening formed through the upper and lower surfaces, wherein at least one first circuit layer and at least one second circuit layer are respectively formed on the upper surface and the lower surface and are electrically connected to each other;
   a lead frame mounted on the upper surface of the substrate and having a plurality of leads electrically connected to the first circuit layer via at least one conductive element;
   at least one chip having an active surface and a non-active surface, wherein the active surface of the chip is mounted on the lead frame and is electrically connected to the leads via a plurality of bonding wires formed in the opening; and
   an encapsulant for filling the opening and encapsulating the chip, the lead frame and the upper surface of the substrate.

2. The semiconductor package of claim 1, wherein the encapsulant encapsulates the periphery of the chip, with the non-active surface being exposed from the encapsulant.

3. The semiconductor package of claim 1, wherein the encapsulant encapsulates the entire chip.

4. The semiconductor package of claim 1, wherein the encapsulant filling the opening has a surface flush with the lower surface of the substrate.

5. The semiconductor package of claim 1, wherein the conductive element is selected from the group consisting of electrically conductive adhesive, solder and bonding wire.

6. The semiconductor package of claim 1, further comprising a plurality of solder balls formed on the second circuit layer.

7. The semiconductor package of claim 1, wherein the substrate further comprises at least one core layer disposed between the first circuit layer and the second circuit layer.

8. The semiconductor package of claim 7, wherein the first circuit layer has a plurality of bonding portions electrically connected to the leads, and the second circuit layer has a plurality of ball pads corresponding to the bonding portions that are electrically connected to the ball pads by conductive vias formed through the core layer.

9. The semiconductor package of claim 8, wherein the balls pads are implanted with solder balls thereon.

10. The semiconductor package of claim 8, wherein a solder mask layer is provided on each of the first circuit layer and the second circuit layer, and is formed with a plurality of holes corresponding to the bonding portions and the ball pads respectively.

11. The semiconductor package of claim 1, wherein the lead frame is attached to the substrate via an insulating tape or an insulating thermally conductive adhesive.

* * * * *